(12) United States Patent
Wrobel et al.

(10) Patent No.: US 10,476,512 B2
(45) Date of Patent: Nov. 12, 2019

(54) PHASE DETECTION METHOD BASED ON A RECEIVING SEQUENCE OF SAMPLED VALUES

(71) Applicant: SONOVUM AG, Leipzig (DE)

(72) Inventors: Miroslaw Wrobel, Karlstadt (DE); Adam Kolany, Leipzig (DE)

(73) Assignee: Sonovum AG, Leipzig (DE)

( * ) Notice: Subject to any disclaimer, the term of this patent is extended or adjusted under 35 U.S.C. 154(b) by 0 days.

(21) Appl. No.: 15/517,413

(22) PCT Filed: Oct. 14, 2015

(86) PCT No.: PCT/EP2015/073736
§ 371 (c)(1),
(2) Date: Apr. 6, 2017

(87) PCT Pub. No.: WO2016/059089
PCT Pub. Date: Apr. 21, 2016

(65) Prior Publication Data
US 2017/0310329 A1    Oct. 26, 2017

(30) Foreign Application Priority Data
Oct. 14, 2014 (DE) ......................... 10 2014 015 126

(51) Int. Cl.
*H03L 7/091* (2006.01)
*G01R 19/25* (2006.01)
(Continued)

(52) U.S. Cl.
CPC .............. *H03L 7/091* (2013.01); *G01R 19/25* (2013.01); *G01R 19/2506* (2013.01);
(Continued)

(58) Field of Classification Search
CPC ..... H03L 7/091; G01R 19/25; G01R 19/2503; G01R 19/2506; G01R 19/2509;
(Continued)

(56) References Cited

U.S. PATENT DOCUMENTS

| 5,404,388 A | * | 4/1995 | Eu ......................... G01R 19/25 379/24 |
| 5,854,995 A | | 12/1998 | Plis et al. |

(Continued)

FOREIGN PATENT DOCUMENTS

WO    2010045979 A1    4/2010

OTHER PUBLICATIONS

Mahmud, High Precision Phase Measurement Using Reduced Sine and Cosine Tables, Proc. of IEEE Instrumentation and Measurement Technology Conference, Apr. 25-27, 1989, pp. 219-222.

(Continued)

*Primary Examiner* — Patrick C Chen
(74) *Attorney, Agent, or Firm* — Quarles & Brady LLP

(57) ABSTRACT

The invention relates to a phase detection method (200) comprising the following steps: receiving (201) a receiving sequence $(Y_j)$ of values $(Y_0, Y_1, \ldots, Y_{N-1})$ of a receiving signal (Y), said values $(Y_0, Y_1, \ldots, Y_{N-1})$ having been sampled with a known sampling frequency $f_s$ and said receiving signal (Y) representing a reaction to a transmitting signal having a known transmitting frequency $f_w$; providing (202) a sine sequence $(S_j)$ and a cosine sequence $(C_j)$ for each index (j) of the receiving sequence $(Y_j)$, said sine sequence $(S_j)$ comprising sine values of consecutive multiples of a known circular frequency, which depends on the transmitting frequency and the sampling frequency, and said cosine sequence $(C_j)$ comprising cosine values of consecutive multiples of the known circular frequency; and determining (203) a phase real part (U) of the receiving signal (Y)

(Continued)

based on a scalar product of the receiving sequence ($Y_j$) with the cosine sequence ($C_j$) and a phase imaginary part (V) of the receiving signal based on a scalar product of the receiving sequence ($Y_j$) with the sine sequence ($S_j$).

15 Claims, 5 Drawing Sheets

(51) Int. Cl.
  *H04M 3/22* (2006.01)
  *H04M 1/24* (2006.01)
  *H04M 3/30* (2006.01)

(52) U.S. Cl.
  CPC ............ *H04M 1/24* (2013.01); *H04M 3/2209* (2013.01); *H04M 3/30* (2013.01)

(58) Field of Classification Search
  CPC ............ G01R 19/2513; G01R 19/2516; G01R 19/252; G01R 19/255; G01R 19/257; H04M 1/24; H04M 3/2209; H04M 3/30; H04M 3/301; H04M 3/302; H04M 3/303; H04M 3/304; H04M 3/305; H04M 3/306; H04M 3/307; H04M 3/308; H04M 3/332; H04M 3/323; H04M 3/326
  USPC .............................................. 327/2
  See application file for complete search history.

(56) References Cited

U.S. PATENT DOCUMENTS

| | | | |
|---|---|---|---|
| 6,246,267 B1 | 6/2001 | Barsoum et al. | |
| 2011/0246100 A1* | 10/2011 | Carvalho | G01F 23/284 702/50 |
| 2012/0041693 A1* | 2/2012 | Liao | G01F 1/667 702/48 |
| 2014/0349595 A1* | 11/2014 | Cox | H04B 1/0458 455/78 |
| 2016/0123998 A1* | 5/2016 | MacIntyre | A61B 5/02042 436/66 |

OTHER PUBLICATIONS

PCT International Search Report, PCT/EP2015/073736, dated Jan. 8, 2016.
PCT English Language Translation of the International Preliminary Report on Patentability, PCT/EP2015/073736, dated Apr. 27, 2017.

* cited by examiner

PHASE DETECTION METHOD BASED ON A RECEIVING SEQUENCE OF SAMPLED VALUES

CROSS-REFERENCE TO RELATED APPLICATIONS

This application represents the national stage entry of PCT International Application No. PCT/EP2015/073736 filed Oct. 14, 2015, which claims priority of German Patent Application 10 2014 015 126.3, filed Oct. 14, 2014, the contents of which are hereby incorporated herein by reference for all purposes.

The present invention relates to a phase detection method and a processor for determining a phase of a receiving signal based on a receiving sequence of sampled values.

Exactly determining the phase of an output signal at the outlet of a transferring medium when being stimulated by an input signal of a known frequency at the inlet is of great importance for a number of applications. The phase information in coding methods in communications engineering can, for example, be used for transmitting communications in the form of electric, magnetic or electromagnetic signals via a communications channel. In the area of materials sciences, measuring the phase of an acoustic wave provides information on the material composition of the transferring medium. In chemical and physical analyzing systems, phase detectors are used for determining temperature, density, phase changes in chemical reactions, object dimensions and concentration of liquids in chemical and physical media. In medical diagnostic methods, tissue characteristics are identified by measuring the phase of acoustic and ultrasonic signals being coupled in. Applications for these purposes include monitoring blood circulation in the body in order to recognize abnormal conditions, in particular in the brain, and mammary sonography.

FIG. 1 shows a schematic view of a system 100 for measuring phase relations of acoustic waves in a vessel 102. The system 100 comprises a vessel 102 which is to be measured, e.g. a body cell, a blood vessel or an artery having a vessel length L and a transmitter 101 and a receiver 103 of ultrasonic waves. The transmitter 101 couples an ultrasonic wave 104 of a known frequency $f_0$ comprising a phase $\varphi_0$ into the vessel 102 at the inlet 105 of the vessel 102, where said ultrasonic wave 104 spreads and is received at the outlet 107 by the receiver 103. As can be seen in FIG. 1, the ultrasonic wave 104 comprises an integer number of oscillatory periods P as well as a partial period, which can be represented as a phase difference $\varphi_1-\varphi_0$. Between the running time $T_P$ of the acoustic wave 104 and the phase difference $\varphi_1-\varphi_0$, the following condition applies:

$$2\pi \cdot f_0 T_P = 2\pi P + (\varphi_1 - \varphi_0). \quad (1)$$

For the phase velocity V in the vessel 102, the following condition applies on the one hand:

$$V + \lambda \cdot f_0, \quad (2)$$

wherein $f_0$ denotes the known transmitting frequency and $\lambda$ denotes the wave length in the vessel 102. On the other hand, the following condition applies for the phase velocity V in the vessel 102:

$$V = \sqrt{\frac{K}{\rho}}, \quad (3)$$

wherein K denotes the elasticity of the vessel and $\rho$ denotes its density. The characteristics of the vessel 102 can therefore be determined from the phase velocity V. The wave length $\lambda$ can be determined from the amount of periods P and from the phase difference $\varphi_1-\varphi_0$, and the phase velocity V can be identified by means of the known transmitting frequency $f_0$, the material characteristics of the vessel 102 being able to be characterized by means of the phase velocity V.

Generally, the receiver is synchronized with the transmitter in order to determine the phase difference $\varphi_1-\varphi_0$, and the received signal is sampled with an analog-to-digital converter. The sampling value of the received signal can be correlated with the point of time of synchronization, from which the phase difference can be determined.

However, the measuring accuracy depends on a plurality of system parameters, such as the sampling accuracy, the accuracy of the set frequency of the transmitting signal, the coupling and uncoupling accuracy of the acoustic signal, interferences of the transmitting signal due to reflections at the vessel ends and vessel walls, Doppler effects, etc.

The object of the present invention is to create a concept for simply and precisely determining the phase at the outlet of a transferring medium when being stimulated by a transmitting signal of a known signal characteristic.

This object is attained by the features of the independent claims. Further advantageous embodiments are the subject matter of the dependent claims.

The methods, devices and systems described in the following can be of different types. The individual elements described can be realized via hardware or software components, such as electronic components, which are produced using different technologies, and can comprise semiconductor chips, ASICs, microprocessors, digital signal processors, integrated electric circuits, electro-optic circuits and/or passive components.

According to a first aspect, the invention concerns a phase detection method comprising the following steps: receiving a receiving sequence of values of a receiving signal, said values having been sampled with a known sampling frequency $f_s$ and said receiving signal representing a reaction to a transmitting signal having a known transmitting frequency $f_w$; providing a sine sequence and a cosine sequence for each index of the receiving sequence, said sine sequence comprising sine values of consecutive multiples of a known circular frequency, which depends on the transmitting frequency $f_w$ and the sampling frequency $f_s$, and said cosine sequence comprising cosine values of consecutive multiples of the known circular frequency; and determining a phase real part of the receiving signal based on a scalar product of the receiving sequence with the cosine sequence and a phase imaginary part of the receiving signal based on a scalar product of the receiving sequence with the sine sequence.

This has the advantage that the phase is able to be easily and precisely determined at the outlet of a transferring medium using a transmitting signal of a known signal characteristic when being stimulated. The two scalar products can be determined with little effort and provide precise values for the phase of the receiving signal when the transmitting frequency and the sampling frequency are known.

According to an embodiment of the phase detection method, a normalization factor of the two scalar products depends on a length of the receiving frequency.

This has the advantage that a normalized scalar product is able to be easily determined for a real part and an imaginary part, respectively, of the phase after receiving each receiving sequence. An exact value can be determined for the phase using the normalization factor.

According to an embodiment of the phase detection method, the sampling frequency $f_s$, by means of which the receiving signal (Y) is sampled, is lesser than a Nyquist-Shannon sampling frequency.

The sampling theorem according to Nyquist and Shannon claims that a signal bandlimited to $f_{max}$ has to be sampled with a frequency of at least $2 \cdot f_{max}$ so that it can be exactly reconstructed from the discrete-time signal. According to this embodiment of the phase detection method, this is no longer necessary. This has the advantage that the sampling frequency $f_s$ is able to be chosen independently of the features of the transferring medium.

According to an embodiment of the phase detection method, the sampling frequency $f_s$, by means of which the receiving signal is sampled, is independent of the Nyquist-Shannon sampling theorem.

According to an embodiment of the phase detection method, the length of the receiving sequence multiplied by a quotient from the known transmitting frequency $f_w$ and the known sampling frequency $f_s$ is an integer and a period of the cosine sequence as well as of the sine sequence.

This has the advantage that the cosine sequence as well as the sine sequence are able to be easily multiplied by the receiving sequence.

According to an embodiment of the phase detection method, the length of the receiving sequence corresponds to a quotient from the sampling frequency $f_s$ and the smallest common denominator from the sampling frequency $f_s$ and the transmitting frequency $f_w$ or to a multiple of the quotient.

This has the advantage that the terms become simplified when determining the scalar product; some become zero while others become constants. Thus, computing the phase can be conducted with little effort.

According to an embodiment, the phase detection method comprises determining a bias of the receiving signal based on a mean of the receiving sequence.

This has the advantage that the bias or the offset, respectively, of the receiving signal is able to be easily determined by determining the mean of the receiving sequence.

According to an embodiment, the known circular frequency $\Omega$ satisfies the following condition: $\Omega=2\pi(f_w/f_s)$, wherein $f_w$ denotes the known transmitting frequency and $f_s$ denotes the known sampling frequency.

According to a second aspect, the invention relates to a processor for determining a phase of a receiving signal, comprising: an n-ary input register, which is configured for storing a receiving sequence of values of the receiving signal, said values having been sampled with a known sampling frequency $f_s$ and said receiving signal representing a reaction to a transmitting signal having a known transmitting frequency $f_w$; an n-ary first parameter register and an n-ary second parameter register, which are configured for storing a sine sequence and a cosine sequence, respectively, said sine sequence comprising sine values of consecutive multiples of a known circular frequency, which depends on the transmitting frequency $f_w$ and the sampling frequency $f_s$, and said cosine sequence comprising cosine values of consecutive multiples of the known circular frequency; a first output register and a second output register, which are configured for providing a phase real part and a phase imaginary part of the receiving signal; and a computing unit, which is configured for determining the phase real part of the receiving signal based on a scalar product of the receiving sequence with the sine sequence as well as for determining the phase imaginary part of the receiving signal based on a scalar product of the receiving sequence with the cosine sequence.

This has the advantage that such a processor is able to easily and precisely determine the phase at the outlet of a transferring medium when being stimulated by a transmitting signal of a known signal characteristic. The processor can determine the two scalar products with little effort and can provide precise values for the phase of the receiving signal when the transmitting frequency and the sampling frequency are known.

According to an embodiment of the processor, a normalization factor of the two normalized scalar products is 2/N, wherein N denotes a length of the receiving sequence.

This has the advantage that the processor is able to easily determine a normalized scalar product for a real part and an imaginary part, respectively, of the phase after receiving each receiving sequence. The processor can determine an exact value for the phase using the normalization factor.

According to an embodiment, the processor comprises a third output register, which is configured for providing a bias of the receiving signal, the computing unit being configured for determining the bias of the receiving signal based on a mean of the receiving sequence.

This has the advantage that the processor is able to easily determine the bias or the offset, respectively, of the receiving signal by computing the mean of the receiving sequence.

According to an embodiment, the circular frequency $\Omega$ satisfies the following condition: $\Phi=2\pi(f_w/f_s)$, wherein $f_w$ denotes the known transmitting frequency and $f_s$ denotes the known sampling frequency.

According to a third aspect, the invention relates to a processor for determining a phase of a receiving signal, comprising: an input register, which is configured for storing a receiving value of a receiving signal sampled with a known sampling frequency $f_s$, said receiving signal representing a reaction to a transmitting signal having a known transmitting frequency $f_w$; a first coefficient register and a second coefficient register, which are configured for storing a first Fourier Coefficient and a second Fourier Coefficient, wherein the first Fourier Coefficient denotes a linear relation between the receiving signal and a phase real part of the receiving signal, and the second Fourier Coefficient denotes a linear relation between the receiving signal and a phase imaginary part of the receiving signal; a first output register and a second output register, which are configured for providing a phase real part and a phase imaginary part of the receiving signal; and a computing unit, which is configured for determining the phase real part of the receiving signal based on an averaged product of the receiving value with the content of the first coefficient register and for determining the phase imaginary part of the receiving signal based on an averaged product of the receiving value with the content of the second coefficient register.

This has the advantage that such a processor is able to easily and precisely determine the phase at the outlet of a transferring medium when being stimulated by a transmitting signal of a known signal characteristic. The processor can determine the two scalar products with little effort and can provide precise values for the phase of the receiving signal when the transmitting frequency and the sampling frequency are known.

According to an embodiment, the processor comprises an instruction unit, which is configured for resetting the second coefficient register to one in response to a reset signal and for deleting the remaining registers; for storing a new receiving value of the sampled receiving signal in response to a clock signal and for providing the first coefficient register and the second coefficient register with new coefficients.

This has the advantage that the processor is able to read the receiving signal in dependence of the clock signal and to carry out a new processing step in every clock. Processing can be carried out very quickly and with little effort depending on the clock.

According to an embodiment of the processor, the computing unit is configured for determining the averaged products based on a temporal averaging of each of the products from the receiving value and the content of the first coefficient register or the content of the second coefficient register, respectively, said products being present in dependence of the clock signal.

This has the advantage that the processor is able to further process each of the products being present in every clock. The result achieved at the end can therefore be computed by using the partial results, i.e. of each of the products being present.

According to an embodiment of the processor, the instruction unit is configured for renewing the second coefficient register using the coefficient $dC \cdot C - dS \cdot S$ in response to the clock signal and for renewing the first coefficient register using the coefficient $dC \cdot S + dS \cdot C$, wherein C denotes the content of the second coefficient register, S denotes the content of the first coefficient register and furthermore $dC = \cos(\Omega)$ and $dS = \sin(\Omega)$ with $\Omega = 2\pi * (f_w/f_s)$ also apply.

This has the advantage that the covariances of the individual sequences are able to be determined step by step so that the computing effort can be divided amongst the individual clocks. The phase of the receiving signal can therefore be determined precisely and effort-effectively.

According to an embodiment, the processor comprises a first internal register and a second internal register; and the instruction unit is configured for incrementing the first internal register by a product from the content of the input register and the content of the first coefficient register in response to the clock signal, and for incrementing the second internal register by a product from the content of the input register and the content of the second coefficient register, and for providing each with a normalization factor normalized in the first output register and the second output register, respectively.

This has the advantage that the phase of the receiving signal is able to be determined step by step and the computation is thus divided amongst the individual clocks of the clock signal.

According to an embodiment, the processor comprises a third output register, which is configured for providing a bias of the receiving signal; and the computing unit is configured for determining the bias of the receiving signal based on a temporal averaging of the content of the input register.

This has the advantage that the processor is able to easily determine the bias or the offset, respectively, of the receiving signal via a temporal averaging of the content of the input register.

Determining the phase and the bias according to the aspects and embodiments described above is important for a number of usages. The phase determined in this manner or the bias determined in this manner, respectively, can be used in coding methods of communications technology for transmitting messages in the form of electric, magnetic or electromagnetic signals via a communications channel. In the area of materials sciences, the phase determined in this manner or the bias determined in this manner, respectively, can give insight into the material characteristics of the transferring medium in terms of an acoustic wave. In chemical or physical analyzing systems, the phase determined in this manner or the bias determined in this manner, respectively, can be used for determining temperature, density, phase changes of chemical reactions, object dimensions and concentration of liquids in chemical and physical media.

In medical diagnostic methods, the phase or the bias, respectively, determined according to the aspects and embodiments described above can be used for identifying characteristics of tissues when acoustic and ultrasonic signals are coupled into said tissues. Embodiments of the invention are used for example when monitoring the circulation of blood in the body in order to recognize abnormal conditions, in particular in the brain, and in mammary sonography. The phase information can give insight into a healthy state as well as a diseased state of the tissue. Information can be gathered from a healthy patient regarding a healthy state of the tissue, for example, by means of measuring the phase according to the described methods and the described processors, respectively, said information serving as a type of reference value. Phase information which is found to deviate from the identified reference value during measurements on patients can be indicative of a patient's diseased state.

Further embodiments are described by way of reference to the attached drawings. In the figures, FIG. 1 shows a schematic view of a system 100 for measuring phase relations of acoustic waves in a vessel 102;

The following detailed description refers to the enclosed drawings, said drawings forming a part thereof and showing specific embodiments of implementing the invention for illustrative purposes. It is understood that other embodiments can also be used and structural or logical changes can be made without deviating from the concept of the present invention. The following detailed description is therefore not to be understood in a limiting sense. Moreover, it is understood that the features of the different exemplary embodiments described herein can be combined with each other, unless something else is specifically indicated.

The aspects and embodiments are described with reference to the drawings, with identical reference numbers generally referring to identical elements. In the following description, numerous specific details are described for the purpose of explaining the invention in order to enable thorough understanding of one or more aspects of the invention. However, it can be obvious to a skilled person that one or more aspects or embodiments can be implemented by a lesser degree of the specific details. In other cases, known structures and elements are shown in a schematic form in order to facilitate describing one or more aspects or embodiments. It is understood that other embodiments can be used and structural or logical changes can be implemented without deviating from the concept of the present invention.

Albeit a certain feature or a certain aspect of an embodiment regarding only one of several implementations may have been disclosed, such a feature or such an aspect can furthermore be combined with one or more other features or aspects of the other implementations, as may be desired or advantageous for any given or specific use. Furthermore, expressions such as "contain", "have", "with" or other variations thereof as used in the description or the claims are to be understood as in an inclusive sense, like the meaning of "comprise". The expressions "coupled" and "connected" may have been used in conjunction with its derivatives. It is understood that such expressions are used for indicating that two elements cooperate or interact with each other independently of whether they are in direct physical or electric contact with each other or whether they are not in direct contact with each other. Moreover, the expressions "such as" and "for example" are to be understood merely as referring to an exemplary embodiment instead of a description of the best or the ideal embodiment. The following description is therefore not to be understood in a limiting sense.

Figure 2:
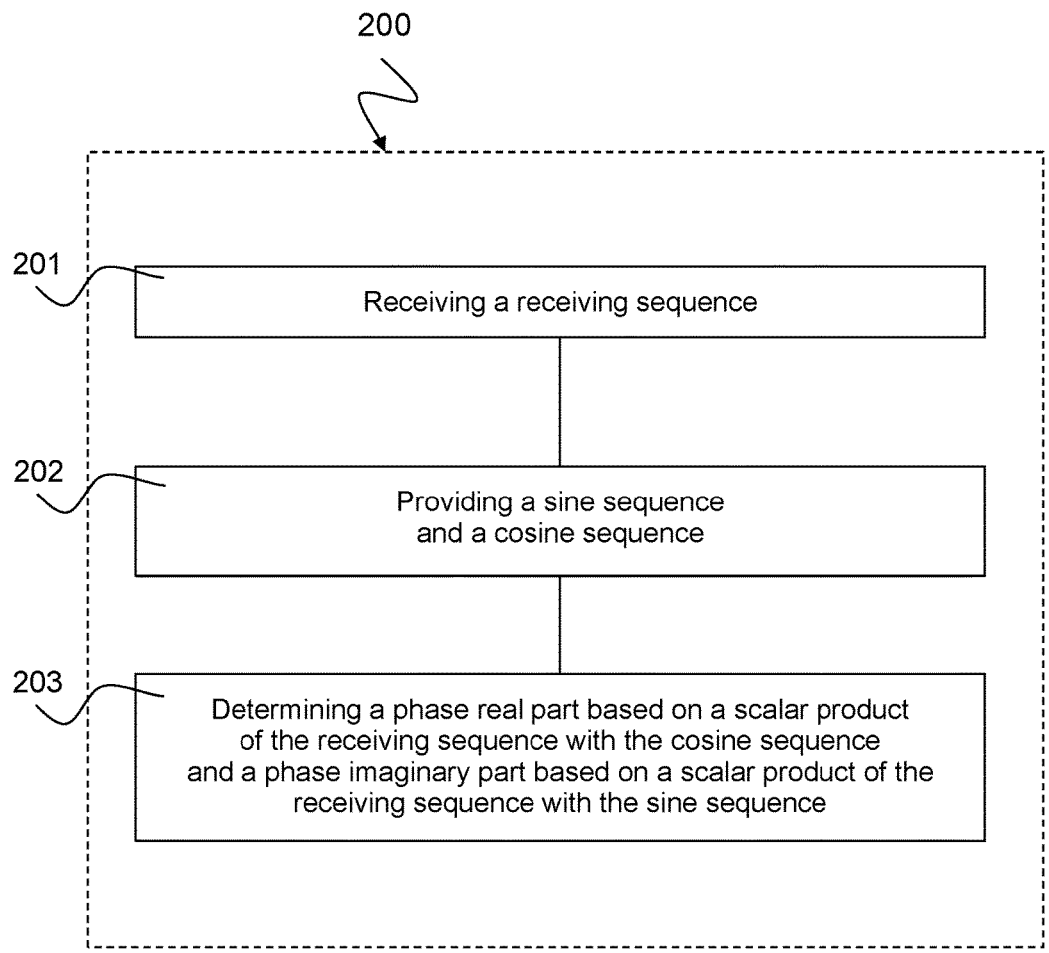
FIG. 2 shows a schematic view of a phase detection method 200 according to an embodiment.

FIG. 2 shows a schematic view of a phase detection method 200 according to an embodiment. The method 200 comprises receiving 201 a receiving sequence $Y_j$ of values $Y_0, Y_1, \ldots, Y_{N-1}$ of a receiving signal Y, said values $Y_0, Y_1, \ldots, Y_{N-1}$ having been sampled with a known sampling frequency $f_s$ and said receiving signal Y representing a reaction to a transmitting signal having a known transmitting frequency $f_w$. The method 200 comprises providing 202 a sine sequence $S_j$ and a cosine sequence $C_j$ for each index j of the receiving sequence $Y_j$, said sine sequence $S_j$ comprising sine values of consecutive multiples of a known circular frequency, which depends on the transmitting frequency $f_w$ and the sampling frequency $f_s$, and said cosine sequence $C_j$ comprising cosine values of consecutive multiples of the known circular frequency. The method 200 comprises determining 203 a phase real part U of the receiving signal Y based on a scalar product of the receiving sequence $Y_j$ with the cosine sequence $C_j$ and a phase imaginary part V of the receiving signal based on a scalar product of the receiving sequence $Y_j$ with the sine sequence $S_j$.

The known circular frequency Ω can satisfy the condition $\Omega = 2\pi(f_w/f_s)$.

A normalization factor 2/N of the two scalar products can depend on a length N of the receiving sequence $Y_j$. The sampling frequency $f_s$, by means of which the receiving signal Y is sampled, can be independent of the Nyquist-Shannon sampling theorem. The length N of the receiving sequence $Y_j$ multiplied by a quotient from the known transmitting frequency $f_w$ and the known sampling frequency $f_s$ can be an integer and a period of the cosine sequence $C_j$ as well as of the sine sequence $S_j$. The length N of the receiving sequence $Y_j$ can correspond to a quotient from the sampling frequency $f_s$ and the smallest common denominator from the sampling frequency $f_s$ and the transmitting frequency $f_w$ or to a multiple of the quotient.

The following representation describes the theoretic principles of the method 200.

A vector $$Y_0, Y_1, \ldots, Y_{N-1} \qquad (4)$$

of sampled values of the function $$Y(\tau) = \beta + A \sin(2\pi f_w \tau + \varphi) \qquad (5)$$

in the sampling frequency $f_S$ is given.

The approximation values of the unknown parameters A, β and φ can be regained by applying a method of least squares while using the following formulas:

$$\begin{bmatrix} Cov(S,Y) \\ Cov(C,Y) \end{bmatrix} = \begin{bmatrix} Cov(S,S) & Cov(S,C) \\ Cov(C,S) & Cov(C,C) \end{bmatrix} \times \begin{bmatrix} A\cos(\varphi) \\ A\sin(\varphi) \end{bmatrix}, \qquad (6a)$$

$$\beta = \overline{Y} - A \cdot (\overline{C}\sin(\varphi) + \overline{S}\cos(\varphi)), \qquad (6b)$$

wherein the term $$Cov(Z,T) = \overline{(Z-\overline{Z}) \cdot (T-\overline{T})} = \overline{ZT} - \overline{Z} \cdot \overline{T} \qquad (7)$$

represents a covariance of the sequences Z and T and the sequences S and C, and
wherein S and C are given via the conditions:

$$S_j = \sin(2\pi \cdot (f_w/f_s) \cdot j), j=0, \ldots, N-1 \qquad (8a)$$

$$C_j = \cos(2\pi \cdot (f_w/f_s) \cdot j), j=0, \ldots, N-1 \qquad (8b).$$

As can be easily seen, the term $$N \cdot (f_w/f_s) \in Z, \qquad (9)$$

is a period of both sequences $\{S_j\}$ and $\{C_j\}$ for every N, wherein Z denotes the number of the integers.

N is then also a multiple of $$\hat{f}_s = \frac{f_s}{ggT(f_s, f_w)}, \qquad (10)$$

wherein ggT denotes the largest common divisor and $$\overline{S} = \frac{1}{N} \cdot \sum_{j=0}^{N-1} S_j = 0, \qquad (11a)$$

$$\overline{C} = \frac{1}{N} \cdot \sum_{j=0}^{N-1} C_j = 0,$$

$$\overline{SC} = \frac{1}{N} \cdot \sum_{j=0}^{N-1} S_j C_j = 0$$

$$\overline{S^2} = \frac{1}{N} \cdot \sum_{j=0}^{N-1} S_j^2 = \frac{1}{2} \text{ and} \qquad (11b)$$

$$\overline{C^2} = \frac{1}{N} \cdot \sum_{j=0}^{N-1} C_j^2 = \frac{1}{2}$$

applies.

The equation (6a) thus takes on the following form:

$$\begin{bmatrix} \overline{S \cdot Y} \\ \overline{C \cdot Y} \end{bmatrix} = \begin{bmatrix} \frac{1}{2} & 0 \\ 0 & \frac{1}{2} \end{bmatrix} \times \begin{bmatrix} A\cos(\varphi) \\ A\sin(\varphi) \end{bmatrix}. \qquad (12)$$

Thus, the following applies:

$$U = A\cos(\varphi) = 2 \cdot \overline{SY} \qquad (13a)$$

$$V = A\sin(\varphi) = 2 \cdot \overline{CY} \qquad (13b)$$

and the searched values can be determined via the following conditions:

$$A = U^2 + V^2, \qquad (14a)$$

$$\varphi = (\arcsin(V/A) \bmod 2\pi), \qquad (14b)$$

$$\beta = \overline{Y}. \qquad (14c)$$

Receiving 201 the receiving sequence $Y_j$ of values $Y_0$, $Y_1, \ldots, Y_{N-1}$ of a receiving signal Y of the method 200, said values having been sampled with a known sampling frequency $f_s$, can be described using the equations (4) and (5).

Providing 202 a sine sequence $S_j$ and a cosine sequence $C_j$ for each index j of the receiving sequence $Y_j$ of the method 200 can be described using the equations (8a), (8b), (9) and (10).

Determining 203 a phase real part U of the receiving signal Y based on a scalar product of the receiving sequence $Y_j$ with the cosine sequence $C_j$ and a phase imaginary part V of the receiving signal based on a scalar product of the receiving sequence $Y_j$ with the sine sequence $S_j$ of the method 200 can be described using the equations (6a), (6b), (7) and (11a) to (14c).

Figure 3:
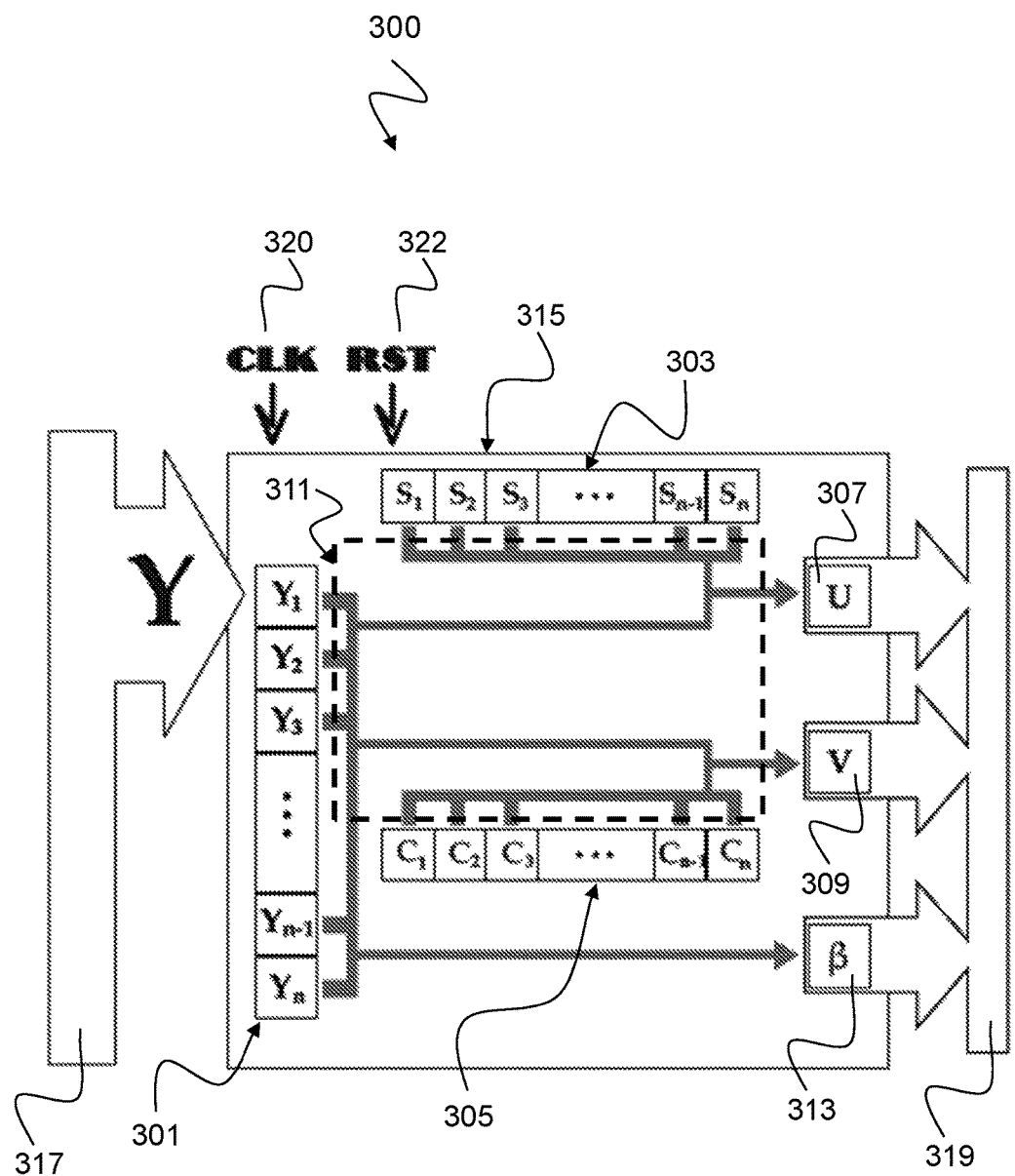
FIG. 3 shows a schematic view of a processor 300 for determining a phase of a receiving signal according to a first embodiment.

FIG. 3 shows a schematic view of a processor 300 for determining a phase of a receiving signal according to a first embodiment.

The processor 300 comprises an n-ary input register 301, an n-ary first parameter register 303, an n-ary second parameter register 305, a first output register 307, a second output register 309, a third output register 313, a computing unit 311 and an instruction unit 315. The processor further comprises an inlet for a clock signal CLK 320 and an inlet for a reset signal RST 322. The processor 300 is coupled to an input data bus 317 on its inlet side and to an output data bus 319 on its outlet side.

The n-ary input register 301 is configured for storing a receiving sequence $Y_j$ of values $Y_0, Y_1, \ldots, Y_{N-1}$ of the receiving signal Y, said values $Y_0, Y_1, \ldots, Y_{N-1}$ having been sampled with a known sampling frequency $f_s$ and said receiving signal Y representing a reaction to a transmitting signal having a known transmitting frequency $f_w$.

The n-ary first parameter register 303 is configured for storing a sine sequence $S_j$, which comprises sine values of consecutive multiples of a known circular frequency $\Omega$, which depends on the transmitting frequency $f_w$ and the sampling frequency $f_s$. The n-ary second parameter register 305 is configured for storing a cosine sequence $C_j$, which comprises cosine values of consecutive multiples of the known circular frequency $\Omega$.

The known circular frequency $\Omega$ can satisfy the condition $\Omega = 2\pi(f_w/f_s)$.

The first output register 307 is configured for providing a phase real part U of the receiving signal. The second output register 309 is configured for providing a phase imaginary part V of the receiving signal.

The computing unit 311 is configured for determining the phase real part U of the receiving signal Y based on a scalar product of the receiving sequence $Y_j$ with the sine sequence $S_j$. The computing unit 311 is further configured for determining the phase imaginary part V of the receiving signal Y based on a scalar product of the receiving sequence $Y_j$ with the cosine sequence $C_j$. A normalization factor of the two scalar products can be chosen as 2/N, wherein N denotes a length of the receiving sequence $Y_j$.

The computing unit 311, which is shown here only as a box using dashed lines, can comprise arithmetic-logic units for executing arithmetic operations. It can comprise adders, multipliers and other units for executing computing operations.

The third output register 313 is configured for providing a bias of the receiving signal Y, said bias being able to be determined by the computing unit 313 based on a mean of the receiving sequence $Y_j$.

Figure 1:
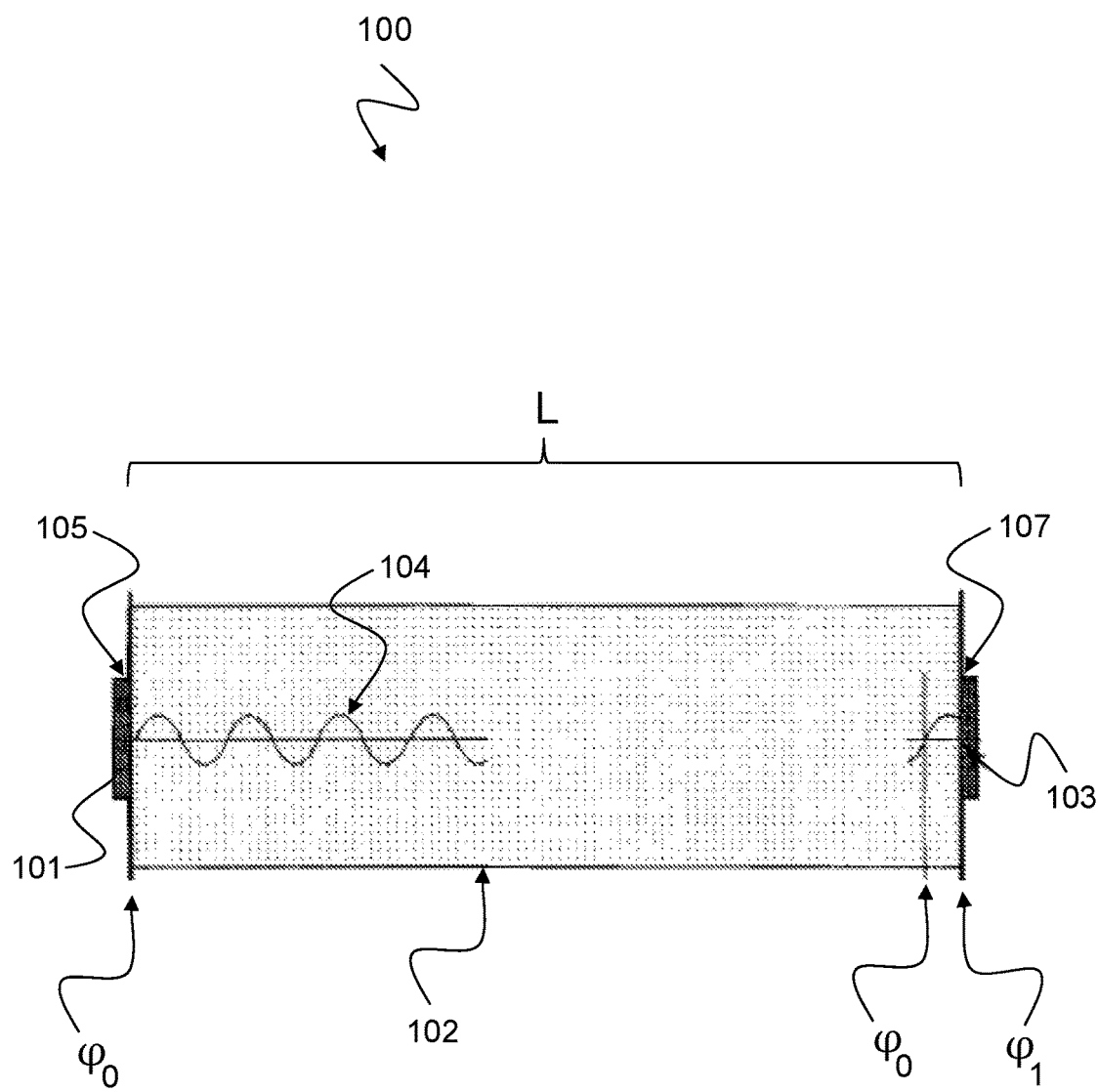

The processor 300 can be realized in hardware or in software. The processor 300 can form an operating unit on a chip or can be realized as a chip. The processor 300 can be a digital signal processor or a microcontroller. The processor 300 can be realized as an FPGA, as an integrated circuit, as an ASIC or as part of these components. The processor 300 can be realized in a receiver or as part of a receiver circuit, such as a receiver 103 as shown in FIG. 1.

The mode of operation of the processor 300 can be described as follows.

The vectors S and C stored in the two parameter registers 303, 305 each contain the sequences:

$$\sin(2\pi\sigma \cdot j), j=0,\ldots,N-1 \text{ and} \quad (15a)$$

$$\cos(2\pi\sigma \cdot j), j=0,\ldots,N-1, \quad (15b)$$

wherein $\sigma$ denotes a quotient from the signal frequency $f_w$ and the sampling frequency $f_s$:

$$\sigma = \frac{f_w}{f_s} = \frac{\hat{f}_w}{\hat{f}_s}. \quad (16)$$

After starting the processor 300 or after receiving the reset signal RST 322, respectively, the data from the input data bus 317 are transmitted into the n-ary input register 301. The values $$\frac{2}{N} Y \circ S \text{ and} \quad (17a)$$

$$\frac{2}{N} Y \circ C, \quad (17b)$$

are uploaded into each of the output registers U and V, wherein Y represents the sequence of sampled values $Y_0$, $Y_1, \ldots, Y_{N-1}$ of the receiving signal Y in vector form and S and C each represent the sine sequence $S_j$ and the cosine sequence $C_j$, respectively, in vector form. The symbol ∘ denotes the scalar product or the inner product, respectively, of two vectors.

The bias $\beta$ can be determined as a mean over the sequence of sampled values $Y_0, Y_1, \ldots, Y_{N-1}$ of the receiving signal Y according to the following condition:

$$\overline{Y} = \frac{1}{N} \sum_{j=1\ldots N} Y_j \quad (18)$$

and is stored in the third output register 313.

Figure 4:
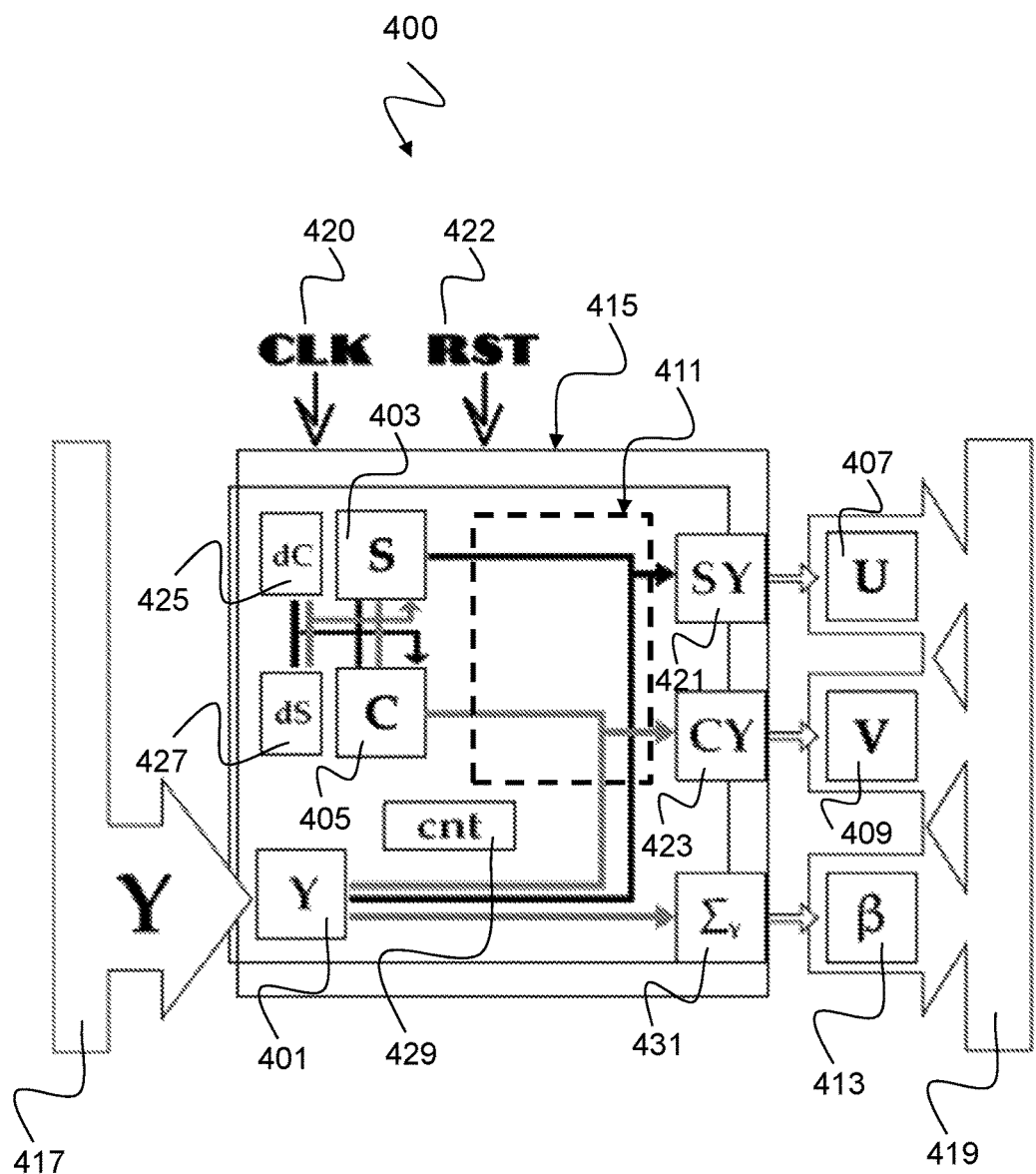
FIG. 4 shows a schematic view of a processor 400 for determining a phase of a receiving signal according to a second embodiment.

FIG. 4 shows a schematic view of a processor 400 for determining a phase of a receiving signal according to a second embodiment.

The processor 400 comprises an input register 401, a first parameter register 403, a second parameter register 405, a third parameter register 425, a fourth parameter register 427, a counter 429, a first output register 407, a second output register 409, a third output register 413, an internal register 421, a second internal register 423, a third internal register 431, a computing unit 411 and an instruction unit 415. The processor 311 further comprises an inlet for a clock signal CLK 420 and an inlet for a reset signal RST 422. The processor 400 is coupled to an input data bus 417 on its inlet side and to an output data bus 419 on its outlet side.

The input register 401 is configured for storing a receiving value of a receiving signal Y sampled with a known sampling frequency $f_s$, said receiving signal Y representing a reaction to a transmitting signal having a known transmitting frequency $f_w$.

The first coefficient register 403 is configured for storing a first Fourier Coefficient S, which denotes a linear relation between the receiving signal Y and a phase real part of the receiving signal Y.

The second coefficient register 405 is configured for storing a second Fourier Coefficient C, which denotes a linear relation between the receiving signal Y and a phase imaginary part of the receiving signal Y.

The first output register 407 is configured for providing a phase real part U of the receiving signal Y. The second output register 409 is configured for providing a phase imaginary part V of the receiving signal Y.

The computing unit 411 is configured for determining the phase real part U of the receiving signal Y based on an averaged product of the receiving value with the content S of the first coefficient register 403. The computing unit 411 is configured for determining the phase imaginary part V of the receiving signal Y based on an averaged product of the receiving value with the content C of the second coefficient register 405.

The computing unit 411, which is shown here only as a box using dashed lines, can comprise arithmetic-logic units for executing arithmetic operations. It can comprise adders, multipliers and other units for executing computing operations.

The instruction unit 415 is configured for setting the second coefficient register 405 to one in response to a reset signal 422 and for deleting the remaining registers. The instruction unit 415 is configured for storing a new receiving value of the sampled receiving signal Y and for providing the first coefficient register 403 and the second 405 coefficient register with new coefficients S, C in response to a clock signal 420.

The computing unit 411 is further configured for determining the averaged products based on a temporal averaging of each of the products from the receiving value and the content S of the first coefficient register 403 or the content C of the second coefficient register 405, respectively, said products being present in dependence of the clock signal 420.

The instruction unit 415 is configured for renewing the second coefficient register 405 with the coefficient dC·C−dS·S in response to the clock signal 420 and for renewing the first coefficient register 403 with the coefficient dC·S+dS·C. In this instance, C denotes the content of the second coefficient register 405 and S denotes the content of the first coefficient register 403. Furthermore, dC=cos(Ω) and dS=sin(Ω) with δ=2π*($f_w/f_s$) applies. The values dC and dS are present in the third parameter register 425 and the fourth parameter register 427, respectively. The counter register 429 can store a counter for counting the means of the averaged products from Y with S and Y with C, respectively.

The instruction unit 415 is configured for incrementing the first internal register 421 by a product SY from the content of the internal register 401 and the content S of the first coefficient register 403 in response to the clock signal 420. The instruction unit 415 is configured for incrementing the second internal register 423 by a product CY from the content of the input register 401 and the content C of the second coefficient register 405 in response to the clock signal 420. The instruction unit 415 is configured for providing the corresponding products, which are normalized by a normalization factor, in the first output register 407 and the second output register 409, respectively.

The third output register 413 is configured for providing a bias β of the receiving signal Y. The computing unit 411 is further configured for determining the bias β of the receiving signal Y based on a temporal averaging of the content of the input register 401.

The processor 400 can be realized in hardware or in software. The processor 400 can form an operating unit on a chip or can be realized as a chip. The processor 400 can be a digital signal processor or a microcontroller. The processor 400 can be realized as an FPGA, as an integrated circuit, as an ASIC or as part of these components. The processor 400 can be realized in a receiver or as part of a receiver circuit, such as a receiver 103 as shown in FIG. 1.

The mode of operation of the processor 400 can be described as follows:

After starting the processor 400 or after receiving the reset signal RST 422, the processor is operated using the given transmitting frequency $f_w$ and the given sampling frequency $f_s$. The counter 429 is set corresponding to the values of $f_w$ and $f_s$. In an embodiment of the processor 400, the above-mentioned condition from equation (10) is met, i.e. N is equal to or a multiple of $\hat{f}_s$:

$$\hat{f}_s = \frac{f_s}{ggT(f_s, f_w)}. \tag{10}$$

The internal registers 421, 423, 431 and the first parameter register 403 are deleted. The second parameter register 405 receives the value one. An input value is then successively stored in the input register 401, said input value being added to the third internal register 431. The first internal register 421 is then incremented by the product Y×S, i.e. the product of the contents of the input register 401 and the first coefficient register 403; the second internal register 423 is incremented by the product Y×C, i.e. the product of the contents of the input register 401 and the second coefficient register 405. Simultaneously, the first internal register 421 is modified corresponding to the rule S←dC·S+dS·C and the second internal register 423 is modified corresponding to the rule C∴dC·C−dS·S. In this instance, dS and dC denote constants comprising the values:

$$dS=\sin(\Omega), \tag{19a}$$

$$dC=\cos(\Omega), \tag{19b}$$

$$\text{in which } \Omega=2\pi\sigma. \tag{19c}$$

The counter 429 is reduced and only when the counter 429 is deleted are the contents of the internal registers 421, 423, 431, i.e. the values $$\frac{2}{N}SY, \frac{2}{N}CY, \frac{1}{N}\Sigma_Y$$

stored as U, V and β in the corresponding output registers 407, 409, 413. U, V and β can then also be transferred onto the output data bus 419.

Subsequently, the processor 400 can be reset by setting the reset signal 422.

Figure 5:
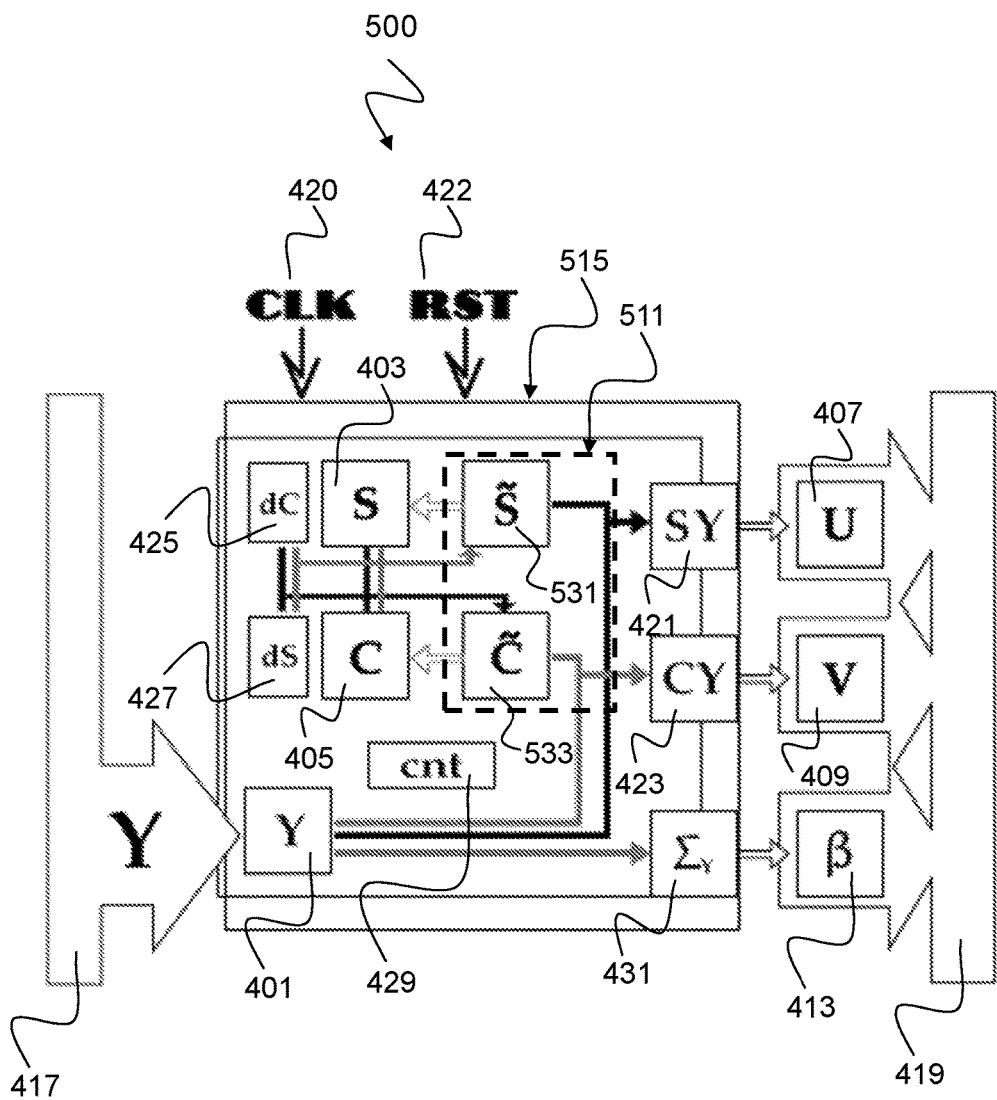
FIG. 5 shows a schematic view of a processor 500 for determining a phase of a receiving signal according to a third embodiment.

FIG. 5 shows a schematic view of a processor 500 for determining a phase of a receiving signal according to a third embodiment.

The processor 500 corresponds to the processor 400 except in that it has two additional internal registers, a fourth internal register 531 and a fifth internal register 533. Accordingly, the computing unit 511 and the instruction unit 515 are designed differently for processing the additional tasks associated therewith.

The fourth internal register 531 and the fifth internal register 533 can be used for storing intermediate results when determining the products Y×S and Y×C. Thus, the fourth internal register 531 can determine the value $\tilde{S}=dC \cdot S+dS \cdot C$, which can then be used for modifying the first internal register 421 according to the rule $S \leftarrow dC \cdot S + dS \cdot C$ or $S \leftarrow \tilde{S}$.

The fifth internal register 533 can determine the value $\tilde{C}=dC \cdot C - dS \cdot S$, which can then be used for modifying the second internal register 423 according to the rule $C \leftarrow dC \cdot C - dS \cdot S$ or $C \leftarrow \tilde{C}$.

The processor 500 can be realized in hardware or in software. The processor 500 can form an operating unit on a chip or can be realized as a chip. The processor 500 can be a digital signal processor or a microcontroller. The processor 500 can be realized as an FPGA, as an integrated circuit, as an ASIC or as part of these components. The processor 500 can be realized in a receiver or as part of a receiver circuit, such as a receiver 103 as shown in FIG. 1.

The processor 300 according to the description of FIG. 3 as well as the processors 400, 500 according to the description of FIGS. 4 and 5 are suitable for implementing the method 200 described in FIG. 2.

An aspect of the invention also comprises a computer program product, which can be uploaded directly into the internal memory of a digital computer and comprises software code sections, by means of which the method 200 described in FIG. 2 can be carried out when the product is running on a computer. The computer program product can be stored on a medium suitable for computers and can comprise the following: machine-readable programming means, which induce a computer to receive 201 a receiving sequence of values of a receiving signal, said values having been sampled with a known sampling frequency $f_s$ and said receiving signal (Y) representing a reaction to a transmitting signal having a known transmitting frequency $f_w$; providing 202 a sine sequence and a cosine sequence for each index of the receiving sequence, said sine sequence comprising sine values of consecutive multiples of a known circular frequency $\Omega$, which depends on the transmitting frequency $f_w$ and the sampling frequency $f_s$, and said cosine sequence comprising cosine values of consecutive multiples of the known circular frequency; and determining 203 a phase real part of the receiving signal based on a scalar product of the receiving sequence with the cosine sequence and a phase imaginary part of the receiving signal based on a scalar product of the receiving sequence with the sine sequence.

The computer can be a PC, for example a PC of a computer network. The computer can be realized as a chip, an ASIC, a microprocessor, a signal processor or as a processor in general and can be implemented as a processor as described in FIGS. 3 to 5, for example.

It is understood that the features of the different exemplary embodiments described herein can be combined with one another, except when explicitly indicated otherwise. As shown in the description and the drawings, individual elements, which are shown in connection with one another, do not have to be directly connected to one another; intermediate elements can be provided between the connected elements. Furthermore, it is understood that embodiments of the invention can be implemented in individual circuits, partially integrated circuits or entirely integrated circuits or programming means. The terms "such as" and "for example" solely refer to an exemplary embodiment and not to the best or the ideal embodiment. Certain embodiments were depicted and described herein, although it is obvious to the skilled person that a plurality of alternative and/or similar implementations can be realized in place of the embodiments shown and described, without deviating from the concept of the present invention.

LIST OF REFERENCES

100: system 100 for measuring phase relations of acoustic waves in a vessel
101: transmitter
102: vessel
103: receiver
104: ultrasonic wave
105: inlet
107: outlet
200: phase detection method 200
201: $1^{st}$ method step: receiving
202: $2^{nd}$ method step: providing
203: $3^{rd}$ method step: determining
300: processor, suitable for determining a phase of a receiving signal
301: n-ary input register
303: n-ary first parameter register
305: n-ary second parameter register
307: first output register
309: second output register
311: computing unit
313: third output register
315: instruction unit
317: input data bus
319: output data bus
320: clock signal
322: reset signal
400: processor, suitable for determining a phase of a receiving signal
401: input register
403: first parameter register
405: second parameter register
407: first output register
409: second output register
411: computing unit
413: third output register
415: instruction unit
417: input data bus
419: output data bus
420: clock signal
422: reset signal
421: first internal register
423: second internal register
431: third internal register
425: third parameter register
427: fourth parameter register
429: counter
500: processor, suitable for determining a phase of a receiving signal
511: computing unit
515: instruction unit
531: fourth internal register
533: fifth internal register

The invention claimed is:

1. A phase detection method for evaluating an open or a closed vessel corresponding to a human tissue, comprising the following steps:
   coupling a transmitter to an inlet of a vessel corresponding to a human tissue, and a receiver to an outlet of the vessel, and transmitting a transmitting signal having a known transmitting frequency $f_w$ from the transmitter into the vessel;
   acquiring a receiving sequence $(Y_j)$ of values $(Y_0, Y_1, \ldots, Y_{N-1})$ of a receiving signal (Y), said values $(Y_0, Y_1, \ldots, Y_{N-1})$ having been sampled with a known sampling frequency $f_s$ and said receiving signal (Y) representing a reaction to the transmitting signal;
   providing a sine sequence $(S_j)$ and a cosine sequence $(C_j)$ for each index (j) of the receiving sequence $(Y_j)$, said sine sequence $(S_j)$ comprising sine values of consecutive multiples of a known circular frequency $(\Omega)$ which depends on the transmitting frequency $f_w$ and the sampling frequency $f_s$, and said cosine sequence $(C_j)$ including cosine values of consecutive multiples of the known circular frequency $(\Omega)$;
   determining a phase real part (U) of the receiving signal (Y) based on a scalar product of the receiving sequence $(Y_j)$ with the cosine sequence $(C_j)$ and a phase imaginary part (V) of the receiving signal based on a scalar product of the receiving sequence $(Y_j)$ with the sine sequence $(S_j)$; and
   determining a phase at the outlet of the transferring medium based on the phase real part (U), the phase imaginary part (V), the known transmitting frequency, and the known sampling frequency,
   comparing the phase or a bias of the receiving signal to a corresponding phase or a corresponding bias of a receiving signal of a known reference vessel corresponding to a healthy human tissue to evaluate the vessel for abnormalities; and
   comparing the phase to a corresponding reference value associated with a reference vessel to identify an abnormal condition.

2. The phase detection method according to claim 1, wherein a normalization factor of the two scalar products depends on a length (N) of the receiving sequence $(Y_j)$.

3. The phase detection method according to claim 2, wherein the normalization factor is 2/N.

4. The phase detection method according to claim 1, wherein the sampling frequency $f_s$, with which the receiving signal (Y) is sampled, is lesser than a Nyquist-Shannon sampling frequency.

5. The phase detection method according to claim 1, wherein the length (N) of the receiving sequence $(Y_j)$, which is multiplied by a quotient from the known transmitting frequency $f_w$ and the known sampling frequency $f_s$, is an integer and a period of the cosine sequence $(C_j)$ as well as of the sine sequence $(S_j)$.

6. The phase detection method according to claim 1, wherein the length (N) of the receiving sequence $(Y_j)$ corresponds to a quotient from the sampling frequency $f_s$ and a smallest common denominator from the sampling frequency $f_s$ and the transmitting frequency $f_w$.

7. The phase detection method according to claim 1, wherein the bias of the receiving signal (Y) is determined based on a mean of the receiving sequence $(Y_j)$.

8. The phase detection method according to claim 1, wherein the known circular frequency $\Omega$ satisfies the following condition: $\Omega = 2\pi(f_w/f_s)$.

9. The phase detection method according to claim 1, wherein the length (N) of the receiving sequence $(Y_j)$ corresponds to a multiple of a quotient from the sampling frequency $f_s$ and a smallest common denominator from the sampling frequency $f_s$ and the transmitting frequency $f_w$.

10. The phase detection method according to claim 1, wherein the vessel comprises at least one of a body cell, a blood vessel, or an artery.

11. The phase detection method according to claim 1, wherein the receiving signal is an ultrasonic signal.

12. The phase detection method according to claim 1, wherein the human tissue comprises a brain tissue or a breast tissue.

13. The phase detection method according to claim 1, wherein the human tissue comprises a blood vessel or an artery.

14. A phase detection method for evaluating a phase at an outlet of a transferring medium comprising a brain or breast tissue, the method comprising the following steps:
   stimulating the transferring medium comprising a brain or breast tissue with a transmitting signal having a known transmitting frequency $f_w$;
   receiving a receiving sequence $(Y_j)$ of values $(Y_0, Y_1, \ldots, Y_{N-1})$ of a receiving signal (Y), said values $(Y_0, Y_1, \ldots, Y_{N-1})$ having been sampled with a known sampling frequency $f_s$;
   providing a sine sequence $(S_j)$ and a cosine sequence $(C_j)$ for each index (j) of the receiving sequence $(Y_j)$, said sine sequence $(S_j)$ comprising sine values of consecutive multiples of a known circular frequency $(\Omega)$ which depends on the transmitting frequency $f_w$ and the sampling frequency $f_s$, and said cosine sequence $(C_j)$ including cosine values of consecutive multiples of the known circular frequency $(\Omega)$; and
   determining a phase real part (U) of the receiving signal (Y) based on a scalar product of the receiving sequence $(Y_j)$ with the cosine sequence $(C_j)$ and a phase imaginary part (V) of the receiving signal based on a scalar product of the receiving sequence $(Y_j)$ with the sine sequence $(S_j)$,
   determining a phase at the outlet of the transferring medium based on the phase real part (U), the phase imaginary part (V), the known transmitting frequency, and the known sampling frequency, and
   comparing to a phase acquired for a reference for the transferring medium to identify abnormalities in the transferring medium.

15. The phase detection method according to claim 14, where the transferring medium is a vessel, and further comprising the steps of providing an ultrasonic transmitter at an inlet of the vessel, transmitting the ultrasonic wave into the vessel, and receiving the ultrasonic wave at a receiver provided at an outlet of the vessel.

* * * * *

UNITED STATES PATENT AND TRADEMARK OFFICE
CERTIFICATE OF CORRECTION

PATENT NO.         : 10,476,512 B2
APPLICATION NO.    : 15/517413
DATED              : November 12, 2019
INVENTOR(S)        : Miroslaw Wrobel et al.

It is certified that error appears in the above-identified patent and that said Letters Patent is hereby corrected as shown below:

In the Specification

Column 8, Line 63, Eq. (14a), "A-U²+V²" should be -- $A = \sqrt{U^2 + V^2}$ --.

Signed and Sealed this
Eighteenth Day of February, 2020

Andrei Iancu
*Director of the United States Patent and Trademark Office*